(12) United States Patent
Momose et al.

(10) Patent No.: US 9,748,186 B2
(45) Date of Patent: Aug. 29, 2017

(54) SEMICONDUCTOR DEVICE AND METHOD FOR MANUFACTURING THE SEMICONDUCTOR DEVICE

(71) Applicant: FUJI ELECTRIC CO., LTD., Kawasaki-shi (JP)

(72) Inventors: Fumihiko Momose, Nagano (JP); Takashi Saito, Matsumoto (JP); Kazumasa Kido, Matsumoto (JP); Yoshitaka Nishimura, Azumino (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/845,256

(22) Filed: Sep. 3, 2015

(65) Prior Publication Data

US 2015/0380368 A1 Dec. 31, 2015

Related U.S. Application Data

(63) Continuation of application No. PCT/JP2014/061457, filed on Apr. 23, 2014.

(30) Foreign Application Priority Data

Apr. 25, 2013 (JP) ................................. 2013-092110

(51) Int. Cl.
*H01L 23/48* (2006.01)
*H01L 23/00* (2006.01)

(52) U.S. Cl.
CPC .............. *H01L 24/05* (2013.01); *H01L 24/03* (2013.01); *H01L 24/43* (2013.01); *H01L 24/45* (2013.01);
(Continued)

(58) Field of Classification Search
CPC ......... H01L 24/05; H01L 24/03; H01L 24/43; H01L 24/45; H01L 24/48; H01L 24/73; H01L 24/85; H01L 24/29
See application file for complete search history.

(56) References Cited

U.S. PATENT DOCUMENTS 5,766,492 A * 6/1998 Sadahisa ............. H01L 21/4846
216/105
2005/0258484 A1* 11/2005 Itou ........................ H01L 24/03
257/341
2010/0258955 A1 10/2010 Miyagawa et al.

FOREIGN PATENT DOCUMENTS

CN 102244062 A 11/2011
JP S61-163235 A 7/1986
(Continued)

OTHER PUBLICATIONS

Machine Translation of JP 5159000 B1.*
(Continued)

*Primary Examiner* — Nicholas Tobergte
(74) *Attorney, Agent, or Firm* — Rabin & Berdo, P.C.

(57) ABSTRACT

A semiconductor device has a module structure in which a semiconductor element and a circuit layer are electrically connected to each other by a wire. A front metal layer is formed on a surface of a top side electrode of the semiconductor element and the wire is bonded to the front metal layer by wire bonding. The front metal layer has a higher hardness than the top side electrode or the wire. A bonding interface of the wire with the metal film has a recrystallization temperature that is equal to or higher than 175° C. According to this structure, it is possible to improve the power cycle resistance of the semiconductor device.

18 Claims, 10 Drawing Sheets

(52) U.S. Cl.
CPC .............. *H01L 24/48* (2013.01); *H01L 24/73* (2013.01); *H01L 24/85* (2013.01); *H01L 24/29* (2013.01); *H01L 2224/04042* (2013.01); *H01L 2224/05124* (2013.01); *H01L 2224/05541* (2013.01); *H01L 2224/05624* (2013.01); *H01L 2224/05647* (2013.01); *H01L 2224/05655* (2013.01); *H01L 2224/29101* (2013.01); *H01L 2224/32225* (2013.01); *H01L 2224/45124* (2013.01); *H01L 2224/45147* (2013.01); *H01L 2224/4851* (2013.01); *H01L 2224/48091* (2013.01); *H01L 2224/48227* (2013.01); *H01L 2224/48724* (2013.01); *H01L 2224/48747* (2013.01); *H01L 2224/48755* (2013.01); *H01L 2224/48824* (2013.01); *H01L 2224/48847* (2013.01); *H01L 2224/48855* (2013.01); *H01L 2224/73265* (2013.01); *H01L 2224/85* (2013.01); *H01L 2224/85203* (2013.01); *H01L 2224/85205* (2013.01); *H01L 2924/2064* (2013.01)

(56) References Cited

FOREIGN PATENT DOCUMENTS

| | | |
|---|---|---|
| JP | H07-135234 A | 5/1995 |
| JP | H08-8288 A | 1/1996 |
| JP | 2004-179484 A | 6/2004 |
| JP | 2004-200644 A | 7/2004 |
| JP | 2008-311383 A | 12/2008 |
| JP | 2009-076703 A | 4/2009 |
| JP | 2010-251483 A | 11/2010 |
| JP | 5159000 B1 | 3/2013 |

OTHER PUBLICATIONS

Machine Translation of JP 2004200644 A.*
Machine Translation of JP 2004179484 A.*
Machine Translation of of JP 2009076703 A.*

* cited by examiner

FIG. 5
(a) BEFORE WIRE BONDING
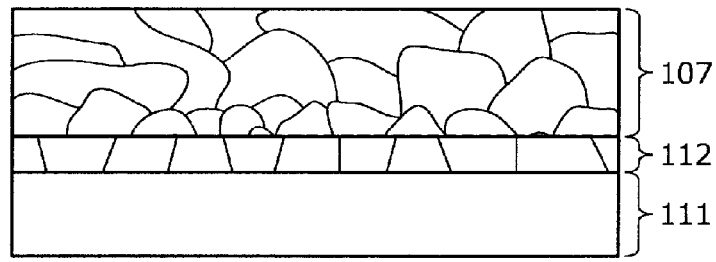
(b) IMMEDIATELY AFTER WIRE BONDING
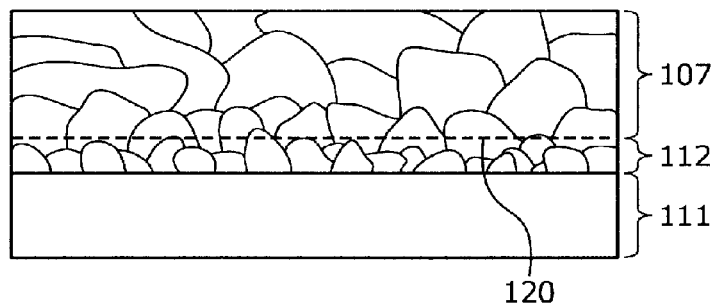
(c) AFTER POWER CYCLE TEST
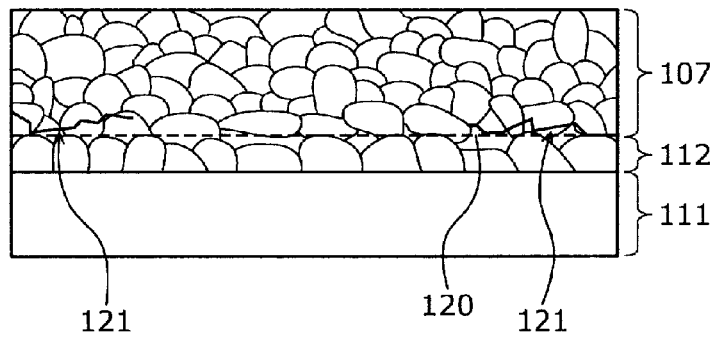

FIG. 6

| | | ULTRASONIC OUTPUT (V) | | | |
|---|---|---|---|---|---|
| | | 9 | 11 | 13 | 15 |
| BONDING LOAD (gf) | 800 | △ | ○ | × | × |
| | 1000 | △ | ○ | ○ | × |
| | 1200 | △ | ○ | ○ | × |
| | 1400 | △ | ○ | ○ | ○ |

FIG. 7

| | | ULTRASONIC OUTPUT (V) | | | |
|---|---|---|---|---|---|
| | | 9 | 11 | 13 | 15 |
| BONDING LOAD (gf) | 800 | △ | △ | △ | ○ |
| | 1000 | △ | ○ | ○ | ○ |
| | 1200 | ○ | ○ | ○ | × |
| | 1400 | ○ | ○ | × | × |

FIG. 12

|  |  | ULTRASONIC OUTPUT (V) | | | |
|---|---|---|---|---|---|
|  |  | 9 | 11 | 13 | 15 |
| BONDING LOAD (gf) | 800 | △ | ○ | ○ | ○ |
|  | 1000 | △ | ○ | ○ | ○ |
|  | 1200 | △ | ○ | ○ | ○ |
|  | 1400 | △ | ○ | ○ | ○ |

FIG. 13

|  |  | ULTRASONIC OUTPUT (V) | | |
|---|---|---|---|---|
|  |  | 18 | 20 | 22 |
| BONDING LOAD (gf) | 1300 | ○ | ○ | ○ |
|  | 1400 | ○ | ○ | ○ |
|  | 1500 | ○ | ○ | ○ |

FIG. 14

|  |  | ULTRASONIC OUTPUT (V) | | |
| --- | --- | --- | --- | --- |
|  |  | 18 | 20 | 22 |
| BONDING LOAD (gf) | 1300 | × | ○ | ○ |
|  | 1400 | ○ | ○ | ○ |
|  | 1500 | × | ○ | ○ |

_US 9,748,186 B2_

SEMICONDUCTOR DEVICE AND METHOD FOR MANUFACTURING THE SEMICONDUCTOR DEVICE

CROSS-REFERENCE TO RELATED APPLICATION(S)

This non-provisional application for a U.S. Patent is a Continuation of International Application PCT/JP2014/061457 filed Apr. 23, 2014, which claims priority from JP PA 2013-092110 filed Apr. 25, 2013, the entire contents of both of which are hereby incorporated by reference.

BACKGROUND OF THE INVENTION

1. Field of the Invention

The present invention relates to a semiconductor device and a method for manufacturing the semiconductor device.

2. Background of the Related Art

A method has been known which electrically connects (bonds) a top side electrode of a semiconductor element and a circuit layer with a wire, such as an aluminum (Al) wire, in a semiconductor device with a module structure that is used in, for example, a general-purpose inverter, a wind power generation system, a photovoltaic generation system, and an electric railroad. The top side electrode is, for example, an aluminum-silicon (Si) electrode or an Al—Si-copper (Cu) electrode and the circuit layer is made of a conductor, such as Cu. In recent years, wire bonding using a Cu wire instead of the Al wire has been examined. The structure of a semiconductor device with a module structure according to the related art will be described below.

FIG. 10 is a cross-sectional view illustrating the structure of the semiconductor device with the module structure according to the related art. FIG. 11 is a cross-sectional view schematically illustrating the structure of a semiconductor element illustrated in FIG. 10. As illustrated in FIGS. 10 and 11, the semiconductor device with the module structure according to the related art includes a semiconductor element 101, an insulated substrate 102, such as a ceramics insulated substrate (direct copper bonding (DCB) substrate), a Cu base 106, and an Al wire 107. In the insulated substrate 102, a circuit layer 104 made of Cu is provided on a front surface of an insulated layer 103 and a copper layer 105 is provided on a rear surface of the insulated layer 103. The semiconductor element 101 includes a top side electrode 112 which is provided on a front surface of a semiconductor die 111 and a bottom side electrode 113 which is provided on a rear surface of the semiconductor die 111.

The bottom side electrode 113 of the semiconductor element 101 is bonded to the circuit layer 104 through a solder layer 101a. The top side electrode 112 of the semiconductor element 101 is electrically connected to the circuit layer 104 by wire bonding using, for example, an Al wire 107. The Al wire 107 is bonded using ultrasonic vibration. Conditions, such as heat, ultrasonic vibration, and welding pressure, for the diameter of the Al wire 107 are optimized to achieve good bonding, without any connection failure. The front surface of the Cu base 106 is bonded to the copper layer 105 through a solder layer (not illustrated).

As the semiconductor device with the module structure, a device has been proposed which includes an aluminum wire that connects an element and an external electrode, has an average crystal grain size of 50 μm or more, and contains 0.02 wt % to 1 wt % of Fe in order to increase a recrystallization temperature to 150° C. or higher such that recrystallization does not occur when the device is turned on, for example, see JP 8-8288 A (Patent Document 1).

As another device, a device has been proposed in which an aluminum wire bonding portion that is bonded to an electrode pad on a semiconductor element by a wire has a uniform crystal grain size, for example, see JP 7-135234 A (Patent Document 2). As still another device, a device has been proposed which contains 4.5 wt % to 6.5 wt % of copper, 0.1 w % to 1.0 w % of zirconium (Zr), and the balance of aluminum, for example, see JP 61-163235 A (Patent Document 3).

As yet another device, a device has been proposed which includes electrodes that are provided on the front and rear surfaces of a semiconductor element, a circuit layer that is provided on an insulated substrate and is bonded to the bottom side electrode, a metal protective film that is formed on the upper surface of the top side electrode, and a wire that is electrically bonded to the top side electrode through the metal protective film by thermo-compression bonding or ultrasonic vibration, for example, see JP 2009-76703 A (Patent Document 4).

However, in recent years, there has been an increasing demand for a technique which increases the amount of current, achieves a high-temperature operation, or increases reliability with the expansion of the purpose of use. In order to meet the demand, it is indispensable to improve power cycle resistance (lifetime). For example, whenever a new technique is proposed, the size of the semiconductor device is reduced and a mounting area is reduced. Therefore, it is difficult to increase the number of Al wires in order to increase the amount of current and there is a concern that the Al wire will be melted and broken due to the generation of heat from the wire when a large amount of current flows to each Al wire.

Factors for determining the power cycle resistance are the maximum value Tjmax of the bonding temperature of the semiconductor element and a variation ΔTj in the bonding temperature of the semiconductor element due to the intermittent flow of a current. In particular, components of the semiconductor device have different linear expansion coefficients and stress corresponding to the difference between the linear expansion coefficients is applied to each component. As the maximum value Tjmax of the bonding temperature of the semiconductor element increases, stress corresponding to the difference between the linear expansion coefficients of the components increases. As a result, there is a concern that the element will be broken. For this reason, it is necessary to improve the power cycle resistance during a high-temperature operation and to achieve a high-temperature operation and high reliability at the same time.

In the semiconductor device according to the related art, the crystal grains in the vicinity of the bonding interface of the Al wire are changed to fine grains by the wire bonding and the bonding strength of the Al wire is improved. Thereafter, the crystal grains in the vicinity of the bonding interface of the Al wire and in the top side electrode are coarsened and softened by a thermal history obtained by a manufacturing process after the wire bonding or the high-temperature operation (for example, about 175° C.) when the semiconductor element is turned on and generates heat. As a result, a crack (breaking) is likely to occur in the vicinity of the bonding interface between the Al wire and the top side electrode. The inventors performed the power cycle test and found that cracks occurred in the Al wire and extended to the inside of the wire with an increase in the number of power cycles, and the Al wire was finally broken and detached, which resulted in the breakdown of the element.

The invention has been made in order to solve the above-mentioned problems of the related art and an object of the invention is to provide a semiconductor device and a method for manufacturing a semiconductor device which can improve power cycle resistance when a large amount of current flows and during a high-temperature operation.

SUMMARY OF THE INVENTION

In order to solve the above-mentioned problems and achieve the object of the invention, according to an aspect of the invention, there is a provided a semiconductor device formed by electrically connecting an electrode of a semiconductor element and a wire using wire bonding. The semiconductor device has the following characteristics. A metal film that has a higher hardness than the wire is provided on a surface of the electrode. The wire is bonded to the metal film by the wire bonding. A recrystallization temperature of a bonding interface of the wire with the metal film is equal to or higher than 175° C.

In the semiconductor device according to the above-mentioned aspect, a crystal grain size of the bonding interface of the wire may be equal to or less than 15 μm and a portion which is away from the bonding interface of the wire may include a crystal grain with a grain size greater than 15 μm.

In the semiconductor device according to the above-mentioned aspect, the wire may have a higher hardness than the electrode.

In the semiconductor device according to the above-mentioned aspect, the metal film may be a nickel-plated film.

In the semiconductor device according to the above-mentioned aspect, the nickel-plated film may have a thickness ranging from 3 μm to 7 μm.

In the semiconductor device according to the above-mentioned aspect, the metal film may be a copper-plated film.

In the semiconductor device according to the above-mentioned aspect, the copper-plated film may have a thickness ranging from 4.5 μm to 10.5 μm.

In order to solve the above-mentioned problems and achieve the object of the invention, according to another aspect of the invention, there is provided a method for manufacturing a semiconductor device in which an electrode of a semiconductor element is electrically connected to a wire. The method includes the following characteristics. First, a step of providing a metal film with a higher hardness than the wire on a surface of the electrode is performed. Then, a step of bonding the wire to the metal film, using ultrasonic vibration of the wire bonding, such that a crystal grain size of a bonding interface of the wire with the metal film is equal to or less than 15 μm is performed.

According to the invention, the recrystallization temperature of the wire is higher than the recrystallization temperature of the aluminum wire according to the related art. Therefore, it is possible to prevent the occurrence of cracks in the wire even under the usage conditions at a temperature higher than that in the related art. As a result, the period until cracks occur in the wire can be longer than that in the related art.

According to the invention, the metal film with a higher hardness than the wire is provided on the surface of the electrode of the semiconductor element (semiconductor chip) to strengthen the electrode. Therefore, it is possible to prevent the occurrence of cracks in the electrode. In addition, the metal film with a higher hardness than the wire is provided on the surface of the electrode and functions as a protective wall. Therefore, even when cracks occur in the wire, it is possible to prevent the extension of the cracks to the electrode.

According to the semiconductor device and the method for manufacturing a semiconductor device of the invention, it is possible to improve power cycle resistance.

BRIEF DESCRIPTION OF THE DRAWINGS

FIG. 5 is a cross-sectional view schematically illustrating the state of crystal grains in the vicinity of a bonding interface of a wire in a semiconductor device according to the related art;

FIG. 6 is a characteristic diagram illustrating the bonding strength of the wire in the semiconductor device according to the embodiment;

FIG. 7 is a characteristic diagram illustrating the bonding strength of the wire in the semiconductor device according to the related art;

FIG. 12 is a characteristic diagram illustrating the bonding strength of the wire in the semiconductor device according to the embodiment;

FIG. 13 is a characteristic diagram illustrating the bonding strength of a wire in another example of the semiconductor device according to the embodiment; and FIG. 14 is a characteristic diagram illustrating the bonding strength of a wire in another example of the semiconductor device according to the related art.

DETAILED DESCRIPTION OF THE INVENTION

Figure 1:
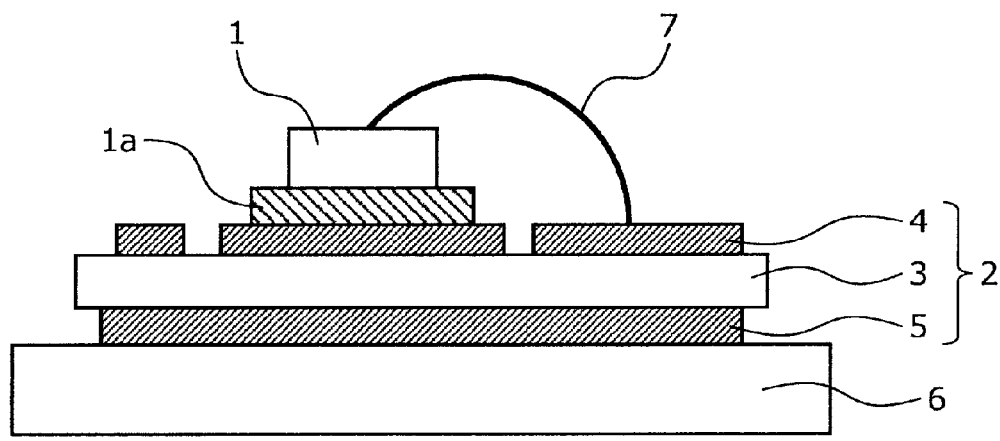
FIG. 1 is a cross-sectional view illustrating the structure of a semiconductor device according to an embodiment.

Hereinafter, preferred embodiments of a semiconductor device and a method for manufacturing a semiconductor device according to the invention will be described in detail with reference to the accompanying drawings. In the description of the following embodiments and the accompanying drawings, the same components are denoted by the same reference numerals and the description thereof will not be repeated.

Embodiments

Figure 2:
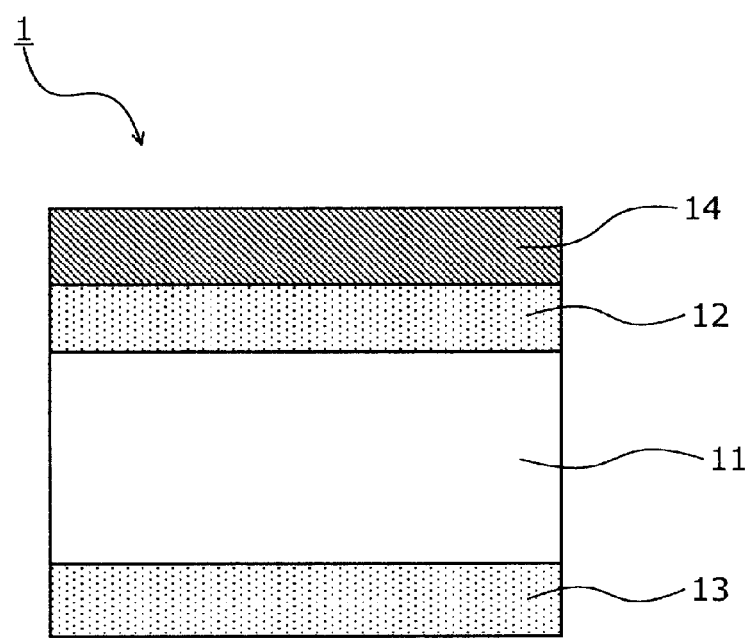
FIG. 2 is a cross-sectional view schematically illustrating the structure of a semiconductor element illustrated in FIG. 1.

The structure of a semiconductor device according to an embodiment will be described. FIG. 1 is a cross-sectional view illustrating the structure of the semiconductor device according to the embodiment. FIG. 2 is a cross-sectional view schematically illustrating the structure of a semiconductor element illustrated in FIG. 1. As illustrated in FIGS. 1 and 2, the semiconductor device according to the embodiment has a module structure including a semiconductor element (semiconductor chip) 1, an insulated substrate 2, such as a ceramics insulated substrate (DCB substrate), a copper (Cu) base 6, and a wire 7. In the insulated substrate 2, a circuit layer 4 which is made of, for example, Cu is provided on the front surface of an insulated layer 3 and a copper layer 5 is provided on the rear surface of the insulated layer 3.

The semiconductor element 1 includes a top side electrode 12 which is provided on the front surface of a semiconductor die (for example, a silicon (Si) substrate, a silicon carbide (SiC) substrate, or a gallium nitride (GaN) substrate) 11 and a bottom side electrode 13 which is provided on the rear surface of the semiconductor die 11. The bottom side electrode 13 of the semiconductor element 1 is bonded to the circuit layer 4 through a solder layer 1a. The copper layer 5 is bonded to the front surface of the Cu base 6 through a solder layer (not illustrated). Although not illustrated in the drawings, a resin case provided with external terminals is attached to the periphery of the Cu base 6. In addition, the rear surface of the Cu base 6 is fixed to a cooler through a thermal compound. In this state, the semiconductor device is used.

The top side electrode 12 of the semiconductor element 1 (hereinafter, simply referred to as a top side electrode) is, for example, an aluminum (Al)-silicon (Si) electrode. The crystal grain size of the top side electrode 12 may be in the range of, for example, 1 μm to 5 μm. A front metal layer 14, such as a nickel (Ni) film or a copper (Cu) film, is formed on the surface of the top side electrode 12 by, for example, electroless plating, electrolytic plating, sputtering, or vapor deposition. The hardness of the front metal layer 14 is higher than that of the top side electrode 12 or the wire 7. The front metal layer 14 has a function of improving the strength of the top side electrode 12 and preventing the occurrence of cracks in the top side electrode 12.

The hardness of the front metal layer 14 may be in the range of, for example, Hv100 to Hv900. The thickness of the front metal layer 14 may be in the range of, for example, 3 μm to 30 μm. When the front metal layer 14 is a Ni-plated film (Hv400 to Hv900), the thickness of the front metal layer 14 is in the range of 3 μm to 7 μm and preferably in the range of 3 μm to 5 μm. The reason why the thickness is equal to or greater than 3 μm is as follows. When the Ni-plated film is used as the front metal layer 14 and the thickness of the plated film is less than 3 μm, the plated film is broken by frictional heat or solid-state flow which occurs when the wire 7 is connected by wire bonding. The breakdown strength of the front metal layer 14 can increase as the thickness of the front metal layer 14 increases. However, the thickness of the front metal layer 14 may be equal to or less than 30 μm and preferably equal to or less than 5 μm, considering throughput or economic efficiency. When the front metal layer 14 is a Cu-plated film, the thickness of the front metal layer 14 is in the range of 4.5 μm to 10.5 μm and preferably in the range of 4.5 μm to 7.5 μm. The hardness of the Cu-plated film is in the range of Hv100 to Hv300. Therefore, when the thickness of the Cu-plated film is about 1.5 times greater than the thickness of the Ni-plated film, it is possible to obtain the same breakdown strength as that of the Ni-plated film. In addition, when the front metal layer 14 is formed by, for example, sputtering or vapor deposition, it may have the above-mentioned hardness and thickness for the same reason as described above.

The top side electrode 12 and the circuit layer 4 are electrically connected to each other through the wire 7. Specifically, for example, one end of the wire 7 is bonded to the front metal layer 14 provided on the surface of the top side electrode 12 by wire bonding using heat, ultrasonic vibration, and pressure (bonding load) and the other end of the wire 7 is bonded to the circuit layer 4 by the wire bonding. A bonding load for bonding the wire 7 and the member to be bonded (the front metal layer 14 and the circuit layer 4), which is applied by, for example, Wire Bonder BJ935 (ultrasonic frequency: 60 kHz) manufactured by Hesse & Knipps GmbH (H&K (trademark)), is in the range of 800 gf to 1400 gf when the ultrasonic output of the wire bonding is equal to or greater than, for example, 11 V and is in the range of 1000 gf to 1400 gf when the ultrasonic output of the wire bonding is equal to or greater than, for example, 13 V.

Specifically, the wire 7 is an aluminum wire with high heat resistance which is made of an alloy including 0.2 to 2.0 mass % of iron (Fe) and the balance of aluminum (Al) with a purity of 99.99% or more, as disclosed in Japanese Patent No. 5159000. A predetermined amount of Fe is contained in the wire 7 to control the crystal grain size of the wire 7 so to be less than that of the aluminum wire according to the related art. The control of the crystal grain size of the wire 7 makes it possible to increase the recrystallization temperature of the wire 7 to at least 175° C. or higher and to increase the hardness of the wire 7 to be higher than that of the top side electrode 12. The hardness of the wire 7 is higher than, for example, the hardness, Hv20, of an AlSi electrode which is the top side electrode 12 immediately after wire bonding.

When the recrystallization temperature of the wire 7 is in the above-mentioned range, the wire 7 is not recrystallized by a thermal history by a manufacturing process after wire bonding or a high-temperature operation (for example, about 175° C.) when the semiconductor element 1 is turned on and generates heat (hereinafter, the thermal history and the generation of heat by the application of a voltage are referred to as the generation of heat by the application of a voltage). Therefore, it is possible to prevent the crystal grains of the wire 7 from being coarsened. When the semiconductor device is turned on and generates heat, the crystal grains of the wire 7 are rarely changed and the hardness of the wire 7 is maintained in the state immediately after wire bonding. Therefore, the wire 7 is less likely to be softened by a power cycle and is less likely to be cracked than that in the related art.

In general, a crack is likely to occur in the vicinity of the bonding interface of the wire 7 due to, for example, the thermal history by the manufacturing process after wire bonding or heat generated by the high-temperature operation when the semiconductor element is turned on and generates heat. For this reason, in the invention, the maximum crystal grain size of the wire 7 before wire bonding may be in the range of, for example, 1 μm to 20 μm. Wire bonding conditions can be controlled to change the crystal grains in the vicinity of the bonding interface of the wire 7 with the member to be bonded (hereinafter, referred to as a bonding interface of the wire 7) to fine grains. The crystal grain size of the wire 7 is preferably set such that crystal grains are changed to fine grains by wire bonding in the range from the bonding interface of the wire 7 to a portion, in which a crack is likely to occur due to the thermal history by the manufacturing process after wire bonding or heat generated by the high-temperature operation when the semiconductor element is turned on and generates heat, in the axial direction of the wire 7.

Specifically, the maximum crystal grain size of the wire 7 in the crystal grain in the vicinity of the bonding interface with the member to be bonded immediately after wire bonding is in the range of, for example, 1 µm to 15 µm (average is 3 µm or less) and the crystal grain size before wire bonding is maintained in a portion (other than the bonding interface of the wire 7) which is away from the bonding interface with the member to be bonded. When the crystal grain size of the wire 7 in the vicinity of the bonding interface immediately after wire bonding is in the above-mentioned range, it is possible to improve the bonding strength of the wire 7. The crystal grain size is evaluated by an electron back scatter diffraction (EBSD) method. A crystal grain boundary is defined to have a crystal orientation of 5° or more and a sample is evaluated. Then, the crystal grain size is measured from the shape of the crystal grain in an image.

The diameter of the wire 7 may be in the range of, for example, 100 µm to 500 µm. Preferably, the wire 7 has a large diameter of, for example, about 500 µm. The reason is that an increase in the diameter of the wire 7 makes it possible to reduce the temperature of the wire when the semiconductor device is turned on.

Next, as an example of a method for forming the front metal layer 14, an example will be described in which a Ni-plated film is formed as the front metal layer 14 on the surface of an AlSi electrode, which is the top side electrode 12, by an electroless nickel plating method. The adhesion between the AlSi electrode and the nickel film is low. Therefore, in general, a zincate treatment is performed as pre-processing of an electroless plating process to improve the adhesion of the nickel-plated film to the AlSi electrode. Specifically, first, a defatting process is performed on the surface of the top side electrode 12 to remove and clean a greasy contaminant or a foreign material attached to the surface. In addition, for example, the wettability of an etchant to the surface of the top side electrode 12 in the subsequent process is improved by the defatting process.

Then, an etching process is performed using an acid solution. In this way, a natural oxide film on the surface of the top side electrode 12 is removed. Then, acid cleaning (desmutting process) is performed using a nitric acid ($HNO_3$) solution to remove smuts which are generated by the etching process. Then, a first zincate treatment is performed to replace Al in the surface of the top side electrode 12 with zinc (Zn), thereby forming a Zn film with a desired crystal grain size on the surface of the top side electrode 12. Then, the Zn film formed on the surface of the top side electrode 12 is removed by a nitric acid solution.

Then, a second zincate treatment is performed to form a Zn film on the surface of the top side electrode 12 again. Then, an electroless Ni plating process is performed to replace the Zn film with a Ni film and Ni is continuously precipitated on the surface of the top side electrode 12 to form a Ni-plated film. In this way, the Ni-plated film is formed as the front metal layer 14 on the surface of the top side electrode 12. The Ni-plated film may be formed as a protective film for the top side electrode 12 by a palladium treatment, instead of the zincate treatment.

Figure 3:
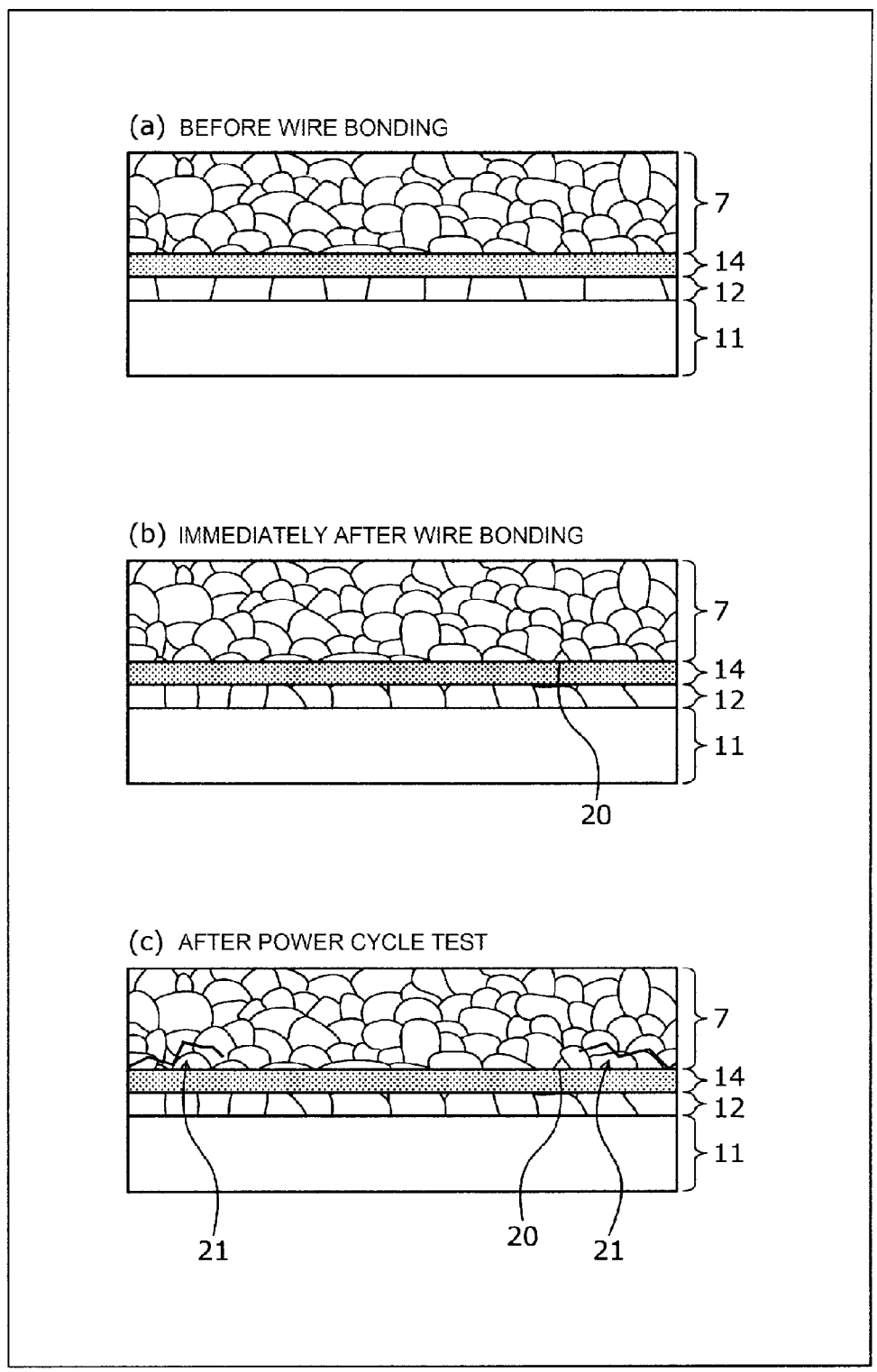
FIG. 3 is a cross-sectional view schematically illustrating the state of crystal grains in the vicinity of a bonding interface of a wire in the semiconductor device according to the embodiment.
Figure 4:
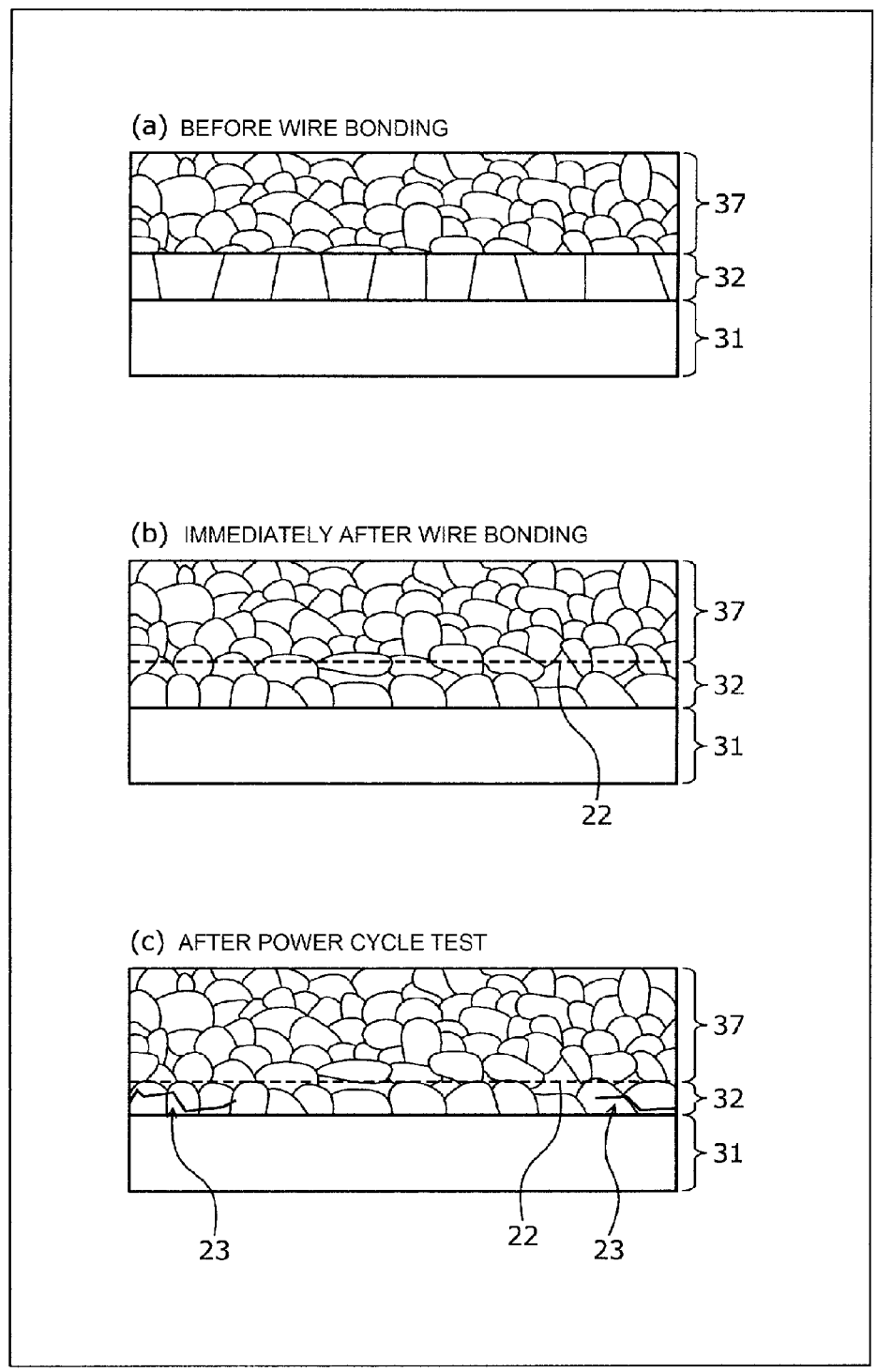
FIG. 4 is a cross-sectional view schematically illustrating the state of crystal grains in the vicinity of a bonding interface of a wire in a semiconductor device according to a reference example.

Then, the crystal grain size of the wire 7 after the semiconductor device is turned on and generates heat will be described. FIG. 3 is a cross-sectional view schematically illustrating the state of the crystal grains in the vicinity of the bonding interface of the wire in the semiconductor device according to the embodiment. FIG. 4 is a cross-sectional view schematically illustrating the state of crystal grains in the vicinity of a bonding interface of a wire in a semiconductor device according to a reference example. FIG. 5 is a cross-sectional view schematically illustrating the state of crystal grains in the vicinity of a bonding interface of a wire in a semiconductor device according to the related art. In FIGS. 3 to 5, (a) illustrates the state of the crystal grains before wire bonding, (b) illustrates the state of the crystal grains immediately after wire bonding, and (c) illustrates the state of the crystal grains after a power cycle test. FIG. 3 schematically illustrates the state of the crystal grains in the vicinity of a bonding interface 20 of the wire 7 which is observed by a microscope after the power cycle test in the semiconductor device according to the above-described embodiment (hereinafter, referred to as an example).

In the example, the diameter of the wire 7 was 400 µm and the crystal grain size of the wire 7 before wire bonding was in the range of 1 µm to 20 µm. The crystal grain size in the vicinity of the bonding interface 20 of the wire 7 after wire bonding was in the range of 1 µm to 15 µm. The crystal grain size in a portion which was away from the bonding interface 20 of the wire 7 after wire bonding was maintained at the value before wire bonding and was in the range of 1 µm to 20 µm. The hardness of the wire 7 after wire bonding is in the range of Hv25 to Hv40. A Ni-plated film (Example 1) with a thickness of 0.3 µm and a Ni-plated film (Example 2) with a thickness of 5 µm were formed as the front metal layer 14. The hardness of the Ni-plated film is Hv900. An AlSi electrode was formed as the top side electrode 12 and the crystal grain size thereof was in the range of 1 µm to 5 µm.

For reference, a semiconductor device (hereinafter, referred to as a reference example) in which the front metal layer 14 was not provided, that is, a wire 37 was bonded to a top side electrode 32 formed on the front surface of a semiconductor die 31 was prepared and the same power cycle test as that in the example was performed on the semiconductor device with the same number of cycles as that in the example. FIG. 4 schematically illustrates the test results. The reference example has the same structure as the example except that the front metal layer 14 is not provided. In addition, the same power cycle test as that in the example was performed on a semiconductor device (hereinafter, referred to as Conventional Example 1), in which an aluminum wire 107 was bonded to a top side electrode 112 formed on the front surface of a semiconductor die 111, with the same number of cycles as that in the example. FIG. 5 schematically illustrates the test results.

In Conventional Example 1, the crystal grain size (maximum) of the Al wire 107 before wire bonding was equal to or greater than 40 µm. The crystal grain size in the vicinity of a bonding interface 120 of the Al wire 107 after wire bonding was in the range of 1 µm to 20 µm. The maximum crystal grain size was greater than 15 µm. The crystal grain size in a portion which was away from the bonding interface 120 of the Al wire 107 after wire bonding was maintained at the value before wire bonding and was equal to or greater than 40 µm. Conventional Example 1 has the same structure as the example except that the Al wire 107 is used and the front metal layer 14 is not provided. The bonding load, ultrasonic amplitude, and bonding time between the wire and the member to be bonded are the same as those in the example, the reference example, and Conventional Example 1.

As illustrated in FIGS. 3(a) and 3(b), in the example, immediately after the wire 7 was bonded to the front metal layer 14, the crystal grain size in the vicinity of the bonding interface 20 of the wire 7 and in the top side electrode 12 was less than that before wire bonding. Thereafter, as illustrated in FIG. 3(c), it was found that the crystal grains of the top side electrode 12 were coarsened and softened with an increase in the number of power cycles. In addition, it was found that, even when the semiconductor device was turned on and generated heat, the crystal grain size in the vicinity of the bonding interface 20 of the wire 7 was substantially equal to that immediately after wire bonding and the hardness of the wire 7 was maintained higher than the hardness of the top side electrode 12 before wire bonding.

As such, in the example, it was found that the crystal grains of the top side electrode 12 were coarsened and softened, but no crack occurred in the top side electrode 12. It is presumed that this is because the top side electrode 12 is strengthened by the front metal layer 14 with higher hardness than the wire 7. In addition, it was found that, even when cracks 21 occurred in the wire 7 and extended to the inside of the wire 7 with an increase in the number of power cycles, the front metal layer 14 provided between the wire 7 and the top side electrode 12 functioned as a protective wall and prevented the cracks 21 in the wire 7 from extending to the top side electrode 12.

As illustrated in FIGS. 4(a) to 4(c), in the reference example, it was found that, although the state of the crystal grains of the wire 37 and the top side electrode 32 was the same as that in the example for the period until cracks occurred immediately after wire bonding, no crack occurred in the wire 37, and cracks 23 occurred in the top side electrode 32. This is because the hardness of the top side electrode 32 is lower than that of the wire 37. These results proved that, when the front metal layer 14 was formed on the surface of the top side electrode 32 as in the example, it was possible to strengthen the top side electrode 32 and to use the wire 7 with higher hardness than the top side electrode 32. In FIG. 4, reference numeral 22 indicates the bonding interface between the wire 37 and the top side electrode 32.

As illustrated in FIGS. 5(a) and 5(b), in Conventional Example 1, immediately after wire bonding, the crystal grains in the vicinity of the bonding interface 120 of the Al wire 107 changed to fine grains and the bonding strength of the Al wire 107 was improved. In this case, the crystal grains of the top side electrode 112 also changed to fine grains. However, thereafter, as illustrated in FIG. 5(c), with an increase in the number of power cycles, the crystal grains in the vicinity of the bonding interface 120 of the Al wire 107 and in the top side electrode 112 were coarsened and softened and cracks 121 occurred in the vicinity of the bonding interface 120 with the top side electrode 112. In addition, in Conventional Example 1, the period until cracks occurred in the Al wire 107 immediately after wire bonding was shorter than that in the example and the reference example (the number of power cycles was less than that in the example and the reference example).

Next, the wire bonding conditions of the wire 7 were verified. Wire Bonder BJ935 (frequency: 60 kHz) manufactured by Hesse & Knipps GmbH was used for the verification. FIGS. 6 and 12 are characteristic diagrams illustrating the bonding strength of the wire in the semiconductor device according to the embodiment. FIG. 7 is a characteristic diagram illustrating the bonding strength of the wire in the semiconductor device according to the related art. A plurality of Examples 1 were manufactured under different wire bonding conditions and the bonding strength of the wire 7 was measured. FIG. 6 illustrates the measurement results. A plurality of Examples 2 were manufactured under different wire bonding conditions and the bonding quality of the wire 7 was measured. FIG. 12 illustrates the measurement results. For comparison, a plurality of Conventional Examples 1 were manufactured under the same wire bonding conditions as those in Examples 1 and 2 and the bonding strength of the Al wire 107 was measured. FIG. 7 illustrates the measurement results. In FIGS. 6, 12, and 7, ○ indicates that the wire has sufficient bonding strength as a product, Δ indicates that the wire has low bonding strength, and x indicates that the wire is detached and the element is broken (these hold for FIGS. 13 and 14).

The results illustrated in FIG. 6 proved that, in Example 1, a bonding load for bonding the wire 7 and the member to be bonded was set in the range of 800 gf to 1400 gf when the ultrasonic output of the wire bonding was equal to or greater than 11 V and was set in the range of 1000 gf to 1400 gf when the ultrasonic output of the wire bonding was equal to or greater than 13 V, which made it possible to sufficiently ensure the bonding strength of the wire 7. The results illustrated in FIG. 12 proved that, in Example 2, when the ultrasonic output of the wire bonding was equal to or greater than 11 V, the range of the bonding load capable of sufficiently ensuring the bonding strength between the wire 7 and the member to be bonded was expanded and it was possible to sufficiently ensure the bonding strength between the wire 7 and the member to be bonded in the entire bonding load range of 800 gf to 1400 gf. That is, the results proved that the thickness of the Ni-plated film (front metal layer 14) increased to expand the range of the bonding load capable of sufficiently ensuring the bonding strength between the wire 7 and the member to be bonded. In contrast, the results illustrated in FIG. 7 proved that, in conventional Example 1, when the bonding load was equal to or greater than 1400 gf at a high ultrasonic output of 13 V or more, the Al wire 107 was detached and the element was broken. Therefore, these results proved that, in Examples 1 and 2, when the ultrasonic output and the bonding load were more than those in Conventional Example 1, it was possible to ensure the bonding strength of the wire 7 in a normal state.

Figure 8:
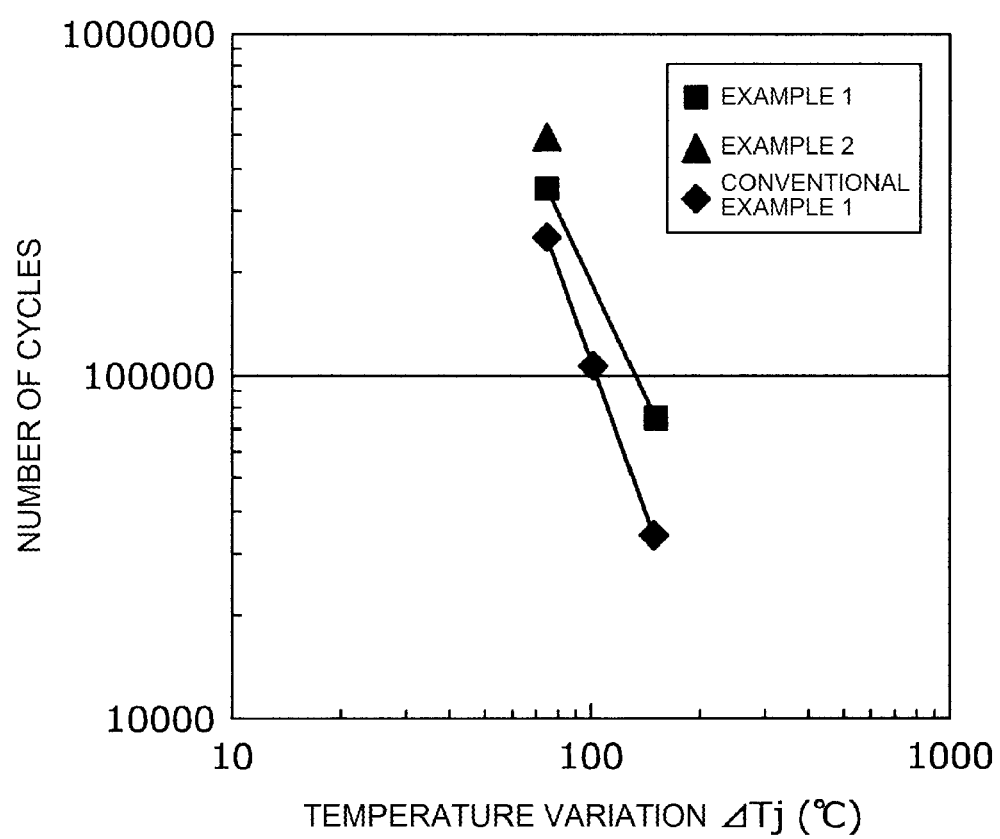
FIG. 8 is a characteristic diagram illustrating the power cycle resistance of the semiconductor device according to the embodiment.

Next, the power cycle resistance of the semiconductor device according to the embodiment was verified. FIG. 8 is a characteristic diagram illustrating the power cycle resistance of the semiconductor device according to the embodiment. FIG. 8 illustrates the relationship between the number of power cycles and a variation $\Delta Tj$ in the bonding temperature of the semiconductor element in Examples 1 and 2 and Conventional Example 1. The maximum value Tjmax of the bonding temperature of the semiconductor element was 175° C. The results illustrated in FIG. 8 proved that, in Examples 1 and 2, the number of power cycles could be more than that in Conventional Example 1 under usage conditions at a high temperature. That is, in Examples 1 and 2, it was possible to increase the power cycle resistance so as to be equal to or greater than two times the power cycle resistance in Conventional Example 1.

Figure 9:
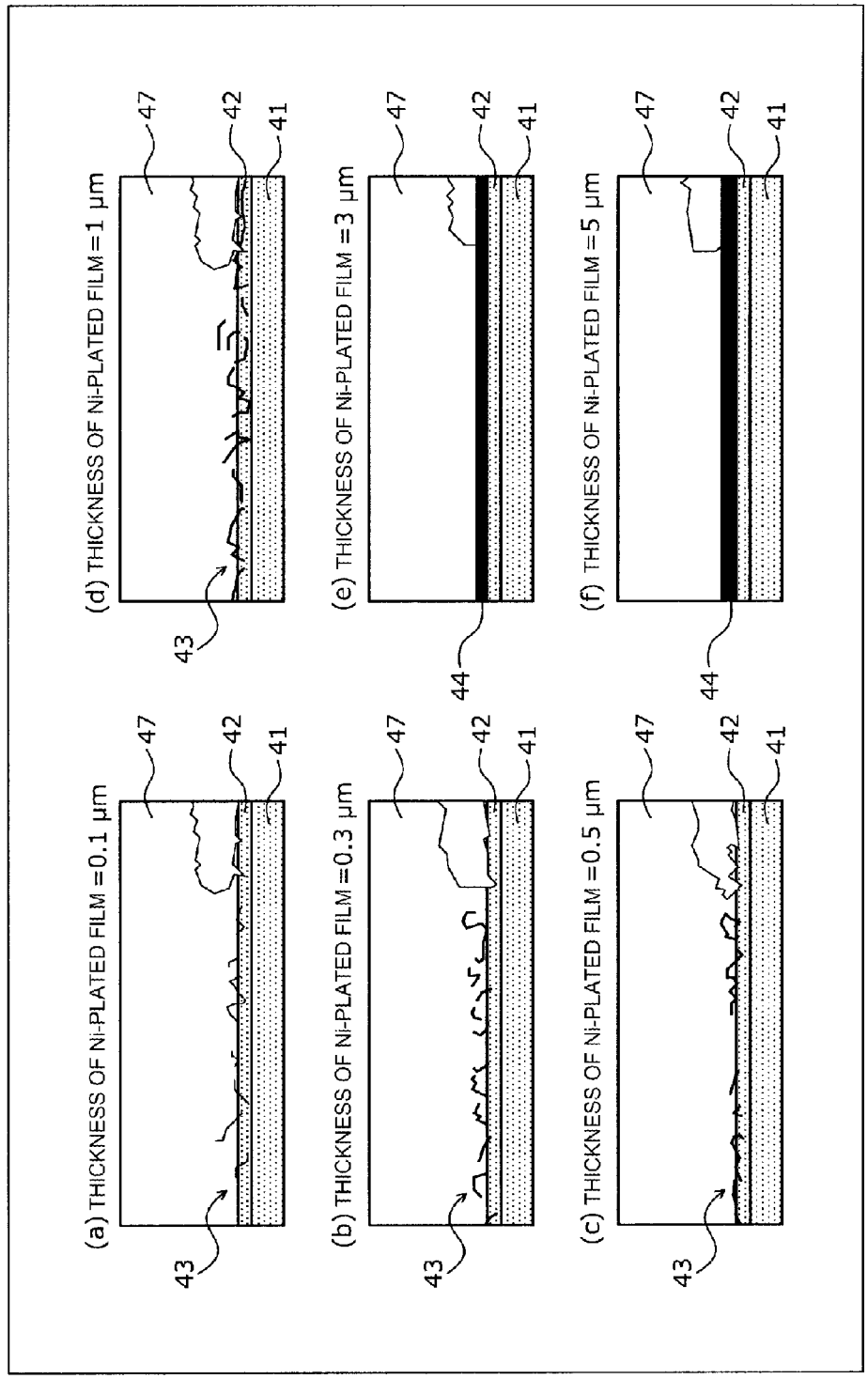
FIG. 9 is a cross-sectional view schematically illustrating the state of the vicinity of the bonding interface of the wire after wire bonding in the semiconductor device according to the embodiment.
Figure 10:
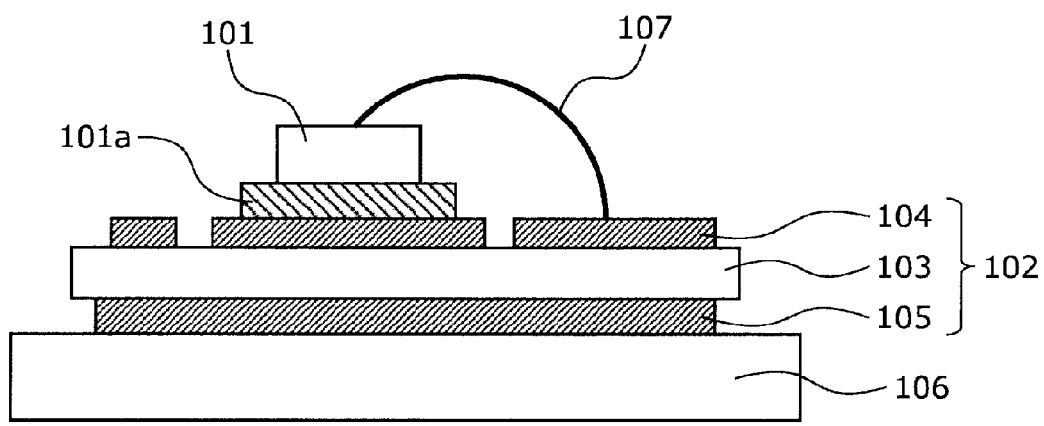
FIG. 10 is a cross-sectional view illustrating the structure of a semiconductor device with a module structure according to the related art.
Figure 11:
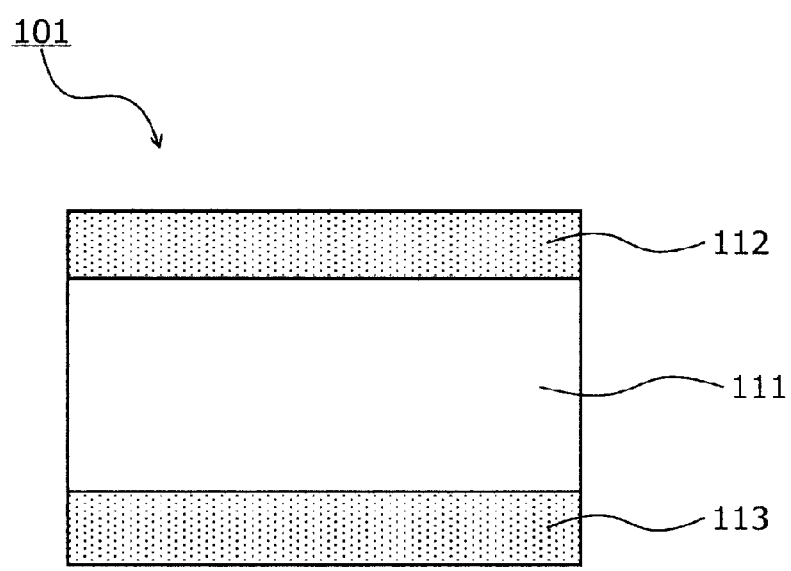
FIG. 11 is a cross-sectional view schematically illustrating the structure of a semiconductor element illustrated in FIG. 10.

FIG. 9 is a cross-sectional view schematically illustrating the state of the vicinity of the bonding interface of the wire after wire bonding in the semiconductor device according to the embodiment. FIGS. 9(a) to 9(f) illustrate the vicinity of a bonding interface of a wire 47 in semiconductor devices in which Ni-plated films with thicknesses of 0.1 μm, 0.3 μm, 0.5 μm, 1 μm, 3 μm, and 5 μm are formed as the front metal layers 14. In FIGS. 9(*a*) to 9(*d*), a Ni-plated film 43 is represented by a segment and the thickness of the segment indicates the thickness of the Ni-plated film 43. In FIGS. 9(*e*) and 9(*f*), a Ni-plated film 44 is represented by a thick black horizontal line and the thickness of the horizontal line (the width of a semiconductor die 41 in the depth direction) indicates the thickness of the Ni-plated film 44.

FIG. 9(*b*) illustrating the Ni-plated film 43 with a thickness of 0.3 μm corresponds to the semiconductor device according to Example 1 and FIG. 9(*f*) illustrating the Ni-plated film 44 with a thickness of 5 μm corresponds to the semiconductor device according to Example 2. As illustrated in FIG. 9(*b*), in Example 1 which the Ni-plated film 43 with a thickness of 0.3 μm was formed, it was found that the Ni-plated film 43 was broken by wire bonding and was dispersed to a bonding interface between an AlSi electrode 42, which was the top side electrode 12, and the wire 47. In Example 1, it was found that the Ni-plated film 43 was cracked immediately after wire bonding, the wire 47 and the AlSi electrode 42 were directly bonded to each other, and the vicinity of the bonding interface of the wire 47 was microscopically in the same state as that in the reference example illustrated in FIG. 4 (*b*); and the state changed to that illustrated in FIG. 4 (*c*) after the power cycle test. In the semiconductor devices illustrated in FIGS. 9(*a*), 9(*c*), and 9(*d*) in which the Ni-plated films 43 with thicknesses of 0.1 μm, 0.5 μm, and 1 μm were formed, the Ni-plated films 43 were cracked after wire bonding, similarly to Example 1.

In contrast, in Example 2 illustrated in FIG. 9(*f*) in which the Ni-plated film 44 with a thickness of 5 μm was formed and the semiconductor device illustrated in FIG. 9(*e*) in which the Ni-plated film 44 with a thickness of 3 μm was formed, it was found that the Ni-plated films 44 were not cracked by wire bonding. As such, the thickness of the front metal layer 14 may be equal to or greater than 3 μm and preferably in the range of 3 μm to 5 μm.

The diameter of the wire 7 increased to 500 μm and the wire bonding conditions of the wire 7 were verified. FIG. 13 is a characteristic diagram illustrating the bonding quality of a wire in another example of the semiconductor device according to the embodiment. FIG. 14 is a characteristic diagram illustrating the bonding quality of a wire in another example of the semiconductor device according to the related art. In FIGS. 13 and 14, ○ indicates that the wire has sufficient bonding strength as a product, Δ indicates that the wire has low bonding strength, and x indicates that the wire is detached and the element is broken. In a semiconductor device (hereinafter, referred to as Example 3) in which a wire 7 with a diameter of 500 μm was bonded to a front metal layer 14 under different wire bonding conditions, the bonding strength of the wire 7 was measured. FIG. 13 illustrates the measurement results. In Example 3, a Ni-plated film with a thickness of 5 μm was formed as the front metal layer 14. The structure of Example 3 is the same as that of Example 2 except that the diameter of the wire 7 is different. In addition, for comparison, in a semiconductor device according to the related art (hereinafter, referred to as Conventional Example 2) in which a wire 37 with a diameter of 500 μm was bonded to a top side electrode 112 under different wire bonding conditions, the bonding strength of the wire 37 was measured. FIG. 14 illustrates the measurement results. The structure of Conventional Example 2 is the same as that of the reference example except that the diameter of the wire 37 is different.

The results illustrated in FIG. 13 proved that, in Example 3, when the thickness of the Ni-plated film (front metal layer 14) was 5.0 μm and the diameter of the wire 7 was 500 μm, the ultrasonic output of wire bonding (18V to 22V) increased, a bonding failure did not occur in a bonding portion between the front metal layer 14 and the wire 7 even though a bonding load for bonding the wire 7 and the member to be bonded increased (1300 gf to 1500 gf), and it was possible to sufficiently ensure the bonding strength of the wire 7. In contrast, the results illustrated in FIG. 14 proved that, in Conventional Example 2, when the diameter of the wire 37 was 500 μm, the ultrasonic output of wire bonding was low (for example, 18 V); and when a bonding load for bonding the wire 37 and the member to be bonded increased (for example, 1500 gf), the element was broken. In the present test, the element breakdown occurred in a region with a low ultrasonic output (for example, 18 V) in Conventional Example 2. However, there is a concern that the breakdown of the element will also occur in a region with a high ultrasonic output in terms of the principle of ultrasonic bonding.

As described above, according to the embodiment, the crystal grain size of the wire is controlled to increase the recrystallization temperature of the wire so as to be higher than the recrystallization temperature of the aluminum wire according to the related art, and the hardness of the wire increases to be higher than the hardness of the top side electrode, which makes it possible to prevent the occurrence of cracks in the wire even under the usage conditions at a higher temperature than the related art. Therefore, the period until a crack occurs in the wire can be longer than that in the related art. In addition, according to the embodiment, since the front metal layer with higher hardness than the wire is provided on the surface of the top side electrode, it is possible to strengthen the top side electrode and thus to prevent the occurrence of cracks in the top side electrode. Furthermore, since the front metal layer with higher hardness than the wire is provided on the surface of the top side electrode, the front metal layer functions as a protective wall. Therefore, even when a crack occurs in the wire, it is possible to prevent the crack from extending to the top side electrode. As such, it is possible to prevent the occurrence of cracks in the top side electrode and the wire and thus to improve power cycle resistance. Therefore, it is possible to provide a semiconductor device with high reliability.

According to the embodiment, when the hardness of the wire increases, large stress is applied to the top side electrode due to the thermal deformation of the wire, but the top side electrode is strengthened by providing the front metal layer which has higher hardness than the wire on the surface of the top side electrode. Therefore, it is possible to prevent the top side electrode from being damaged.

Various modifications and changes of the invention can be made and, for example, the dimensions of each component can vary depending on required specifications in each of the above-described embodiments.

INDUSTRIAL APPLICABILITY

As described above, the semiconductor device and the method for manufacturing a semiconductor device according to the invention are useful for a semiconductor device with a module structure which is used in, for example, a general-purpose inverter, wind power generation, photovoltaic power generation, and an electric railroad.

EXPLANATIONS OF LETTERS OR NUMERALS

1 SEMICONDUCTOR ELEMENT
1*a* SOLDER LAYER

2 INSULATED SUBSTRATE
3 INSULATED LAYER
4 CIRCUIT LAYER
5 COPPER LAYER
6 Cu BASE
7 WIRE
11 SEMICONDUCTOR DIE
12 TOP SIDE ELECTRODE
13 BOTTOM SIDE ELECTRODE
14 FRONT METAL LAYER
20 BONDING INTERFACE OF WIRE
21 CRACK

What is claimed is:

1. A semiconductor device that is formed by electrically connecting an electrode of a semiconductor element and a wire using wire bonding, comprising:
a metal film that has a higher hardness than the wire and is provided on a surface of the electrode,
wherein the wire is bonded to the metal film by the wire bonding to provide a bonding interface, the bonding interface of the wire with the metal film has a recrystallization temperature that is higher than 175° C., and the semiconductor element has a bonding temperature that is less than the recrystallization temperature of the bonding interface, and
wherein the bonding interface of the wire has a crystal grain size that is only equal to or less than 15 μm, and a portion which is away from the bonding interface of the wire includes a crystal grain with a grain size greater than 15 μm.

2. The semiconductor device according to claim 1, wherein the metal film is a nickel-plated film.

3. The semiconductor device according to claim 2, wherein the nickel-plated film has a thickness ranging from 3 μm to 7 μm.

4. The semiconductor device according to claim 1, wherein the metal film is a copper-plated film.

5. The semiconductor device according to claim 4, wherein the copper-plated film has a thickness ranging from 4.5 μm to 10.5 μm.

6. The semiconductor device according to claim 1, wherein the wire has a higher hardness than that of the electrode.

7. The semiconductor device according to claim 6, wherein the metal film is a nickel-plated film.

8. The semiconductor device according to claim 7, wherein the nickel-plated film has a thickness ranging from 3 μm to 7 μm.

9. The semiconductor device according to claim 6, wherein the metal film is a copper-plated film.

10. The semiconductor device according to claim 9, wherein the copper-plated film has a thickness ranging from 4.5 μm to 10.5 μm.

11. A method for manufacturing a semiconductor device according to claim 1 in which an electrode of a semiconductor element is electrically connected to a wire, comprising:
providing a metal film having a hardness that is higher than that of the wire on a surface of the electrode; and
bonding the wire to the metal film using ultrasonic vibration to provide a bonding interface having a crystal grain size that is only equal to or less than 15 μm.

12. The semiconductor device according to claim 1, wherein the wire is made of an aluminum alloy including 0.2 to 2.0 mass % of iron and the balance aluminum with a purity of 99.99% or more.

13. The semiconductor device according to claim 1, wherein the wire is directly connected to the metal film.

14. A semiconductor device that is formed by electrically connecting an electrode of a semiconductor element and a wire using wire bonding, comprising:
a metal film that is a copper film consisting of copper, that has a thickness ranging from 4.5 μm to 10.5 μm, that has a higher hardness than that of the wire, and that is provided on a surface of the electrode,
wherein the wire has a higher hardness than that of the electrode and is bonded to the metal film by the wire bonding to provide a bonding interface, and the bonding interface of the wire with the metal film has a recrystallization temperature that is higher than 175° C.

15. The semiconductor device according to claim 1, wherein the bonding interface of the wire has a crystal grain size that is only equal to or less than 15 μm, and a portion which is away from the bonding interface of the wire includes a crystal grain with a grain size greater than 15 μm.

16. The semiconductor device according to claim 1, wherein the wire is made of an aluminum alloy including 0.2 to 2.0 mass % of iron and the balance aluminum with a purity of 99.99% or more.

17. The semiconductor device according to claim 1, wherein the wire is directly connected to the metal film.

18. A method for manufacturing a semiconductor device according to claim 15 in which an electrode of a semiconductor element is electrically connected to a wire, comprising:
providing a metal film having a hardness that is higher than that of the wire on a surface of the electrode; and
bonding the wire to the metal film using ultrasonic vibration to provide a bonding interface having a crystal grain size that is only equal to or less than 15 μm.

* * * * *